United States Patent Office 3,522,454

Patented Aug. 4, 1970

3,522,454

PULSE CONTROL CIRCUIT

Wayne D. Gilmour, Ottawa, Ontario, Canada, assignor to Northern Electric Company Limited, Montreal, Quebec, Canada Filed July 8, 1968, Ser. No. 743,161
Int. Cl. H03k *1/18*
U.S. Cl. 307—265 10 Claims

ABSTRACT OF THE DISCLOSURE

A first MOS transistor is connected in series with a R-C timing branch. Upon application of an input pulse at the gate of the first MOS transistor, a voltage change is created across the capacitor of the timing branch which voltage change is applied to the gate of a second MOS transistor connected in series with the first MOS transistor and the timing branch to form a Miller integrator connection to provide a substantially linear voltage change. The junction between the first and second MOS transistors is connectd to the gate of a third MOS transistor, and an output terminal is connected to the junction of the third MOS transistor and an associated load resistor. To provide a limit for the voltage change across the capacitor, a diode connects the junction between the timing branch resistor and capacitor and the tap of a voltage divider which includes another MOS transistor.

The present invention relates to an electrical circuit for generating an output pulse of controlled characteristics upon application of an input pulse.

Existing pulse control circuits are known to employ bipolar transistors, vacuum tubes or similar electronic switching elements of the conventional types.

An MOS transistor (also referred to as Metal Oxide Semiconductor Field Effect Transistor, abbreviated MOSFET or MOS transistor), differs from the above-mentioned electronic switching elements in some essential respects, particularly in the manner of manufacture which allows simple forming of integrated circuits comprising a number of MOS transistors in combination with other circuit elements. As to operation, one of the major distinctions of an MOS transistor from other control switching elements exists in the fact that the controlling electrode, called the "gate," is galvanically isolated from the controlled current electrodes, called the "source" and the "drain." A further special feature of the MOS transistor resides in the presence of a so-called "threshold" which is a predetermined voltage between gate and source of the element, at which voltage an abrupt change in the resistance of the current path, i.e. between source and drain takes place.

If a pulse control circuit of the initially mentioned kind is to be used in connection with other circuitry employing MOS transistors, it is also desirable in such circuit to use only MOS transistors as switching elements to enable the entire circuit to be formed on the same chip. According to a preferred embodiment of the present invention, a circuit for generating a pulse of controlled characteristics comprises a series connection extending from a first voltage supply terminal through the current electrodes of a first MOS transistor then through the current electrodes of a second MOS transistor and then through a load resistance to a second voltage supply terminal; and a timing branch including a series circuit of a capacitance and a resistance and extending from the junction betwen the second MOS transistor and the load resistance to the second supply terminal, wherein the gate of the first MOS transistor is connected to the junction between the capacitance and the resistance of the timing branch. The circuit further comprises means for supplying to the gate of the first MOS transistor a clamping potential within the on-condition of the first MOS transistor, this means being such as to limit the difference between the clamping potential and the threshold potential at the gate to a value small in comparison with the voltage across said first and second supply terminals. Furthermore, input means are connected to the gate of the second MOS transistor and output means are connected to the junction between the first and the second MOS transistors.

In this circuit, the first and second MOS transistors are used in the so-called Miller-integrator connection with the result of a substantially linear wave form across the timing branch capacitance.

To provide a substantially rectangular output pulse, the circuit means comprises a further series connection extending from the first to the second supply terminal through the current electrodes of a third MOS transistor and another load resistance with an output terminal being connected to the junction between the third MOS transistor and the other load resistance, while the gate of the third MOS transistor is connected to the junction between the first and second MOS transistors.

The timing branch resistance may include a potentiometer to enable variation of the ramp voltage across the timing branch capacitance or of the output pulse width.

According to another embodiment of the present invention, the output means comprises still another series connection extending from the first to the second supply terminal through the current electrodes of a fourth MOS transistor and a further load resistance, and also comprises another output terminal connected to the junction between the fourth MOS transistor and the further load resistance, whereby the gate of the fourth MOS transistor is connected to the junction between the third MOS transistor and the associated load resistance. Such second output terminal will provide an output pulse being opposite in sign and having substantially the same width as the pulse created at the first output terminal.

According to another embodiment of the invention, the circuit comprises still another series connection extending from the first to the second supply terminal through the current electrodes of two further MOS transistors and a further load resistance and further comprises another output terminal connected to the junction between the further load resistance and the adjacent MOS transistor, wherein the gate of such adjacent MOS transistor is connected to the junction between the above-mentioned third MOS transistor and the associated load resistance and the gate of the other MOS transistor is connected to the input. Such other output terminal provides a secondary output pulse the leading edge of which coincides substantially with the trailing edge of the primary output pulse and the trailing edge of which coincides with the trailing edge of the input pulse. Also, since the other MOS transistor is gated by the input signal, it prevents, in the rest condition of the circuit, any residual current from flowing through such last mentioned series connection.

Another feature of the invention resides in the fact that each of the mentioned load resistances may be formed by a MOS transistor, thus enabling the entire circuit, except for the elements of the timing branch, to be built up from MOS transistors.

Further features of the present invention will appear from the following specific description which is provided by way of example only.

Figure 1:
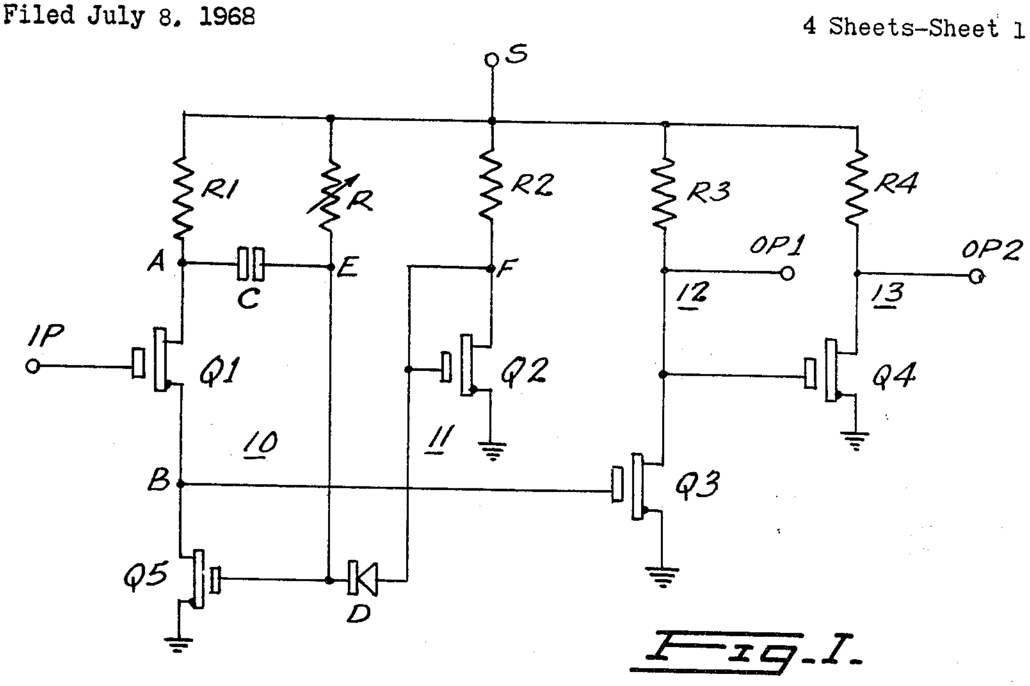
FIG. 1 shows a first embodiment of a pulse control circuit.
Figure 3A:
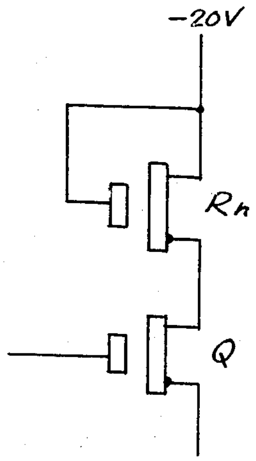
Figure 3B:
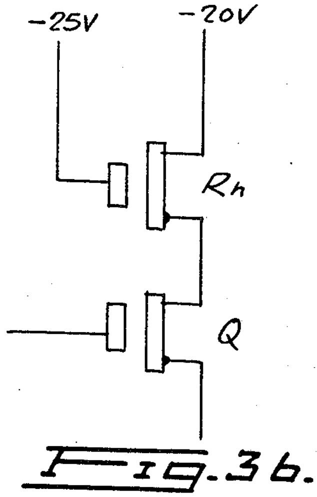
Figure 6A:
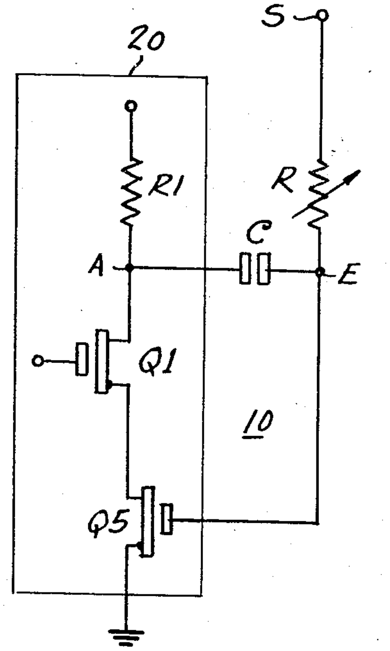
Figure 6B:
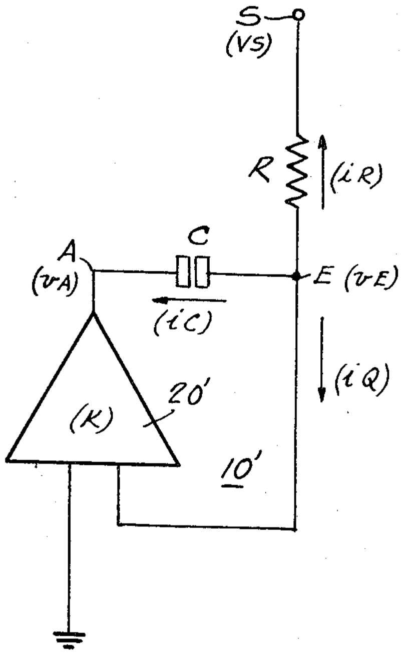
Figure 4A:
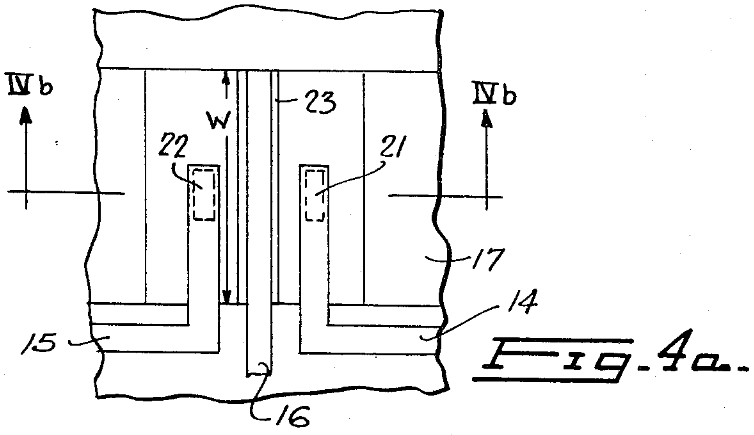
Figure 4B:
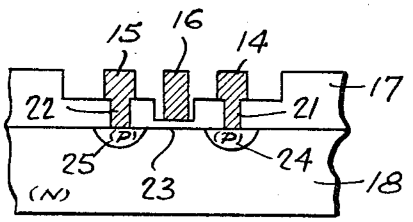
Figure 5:
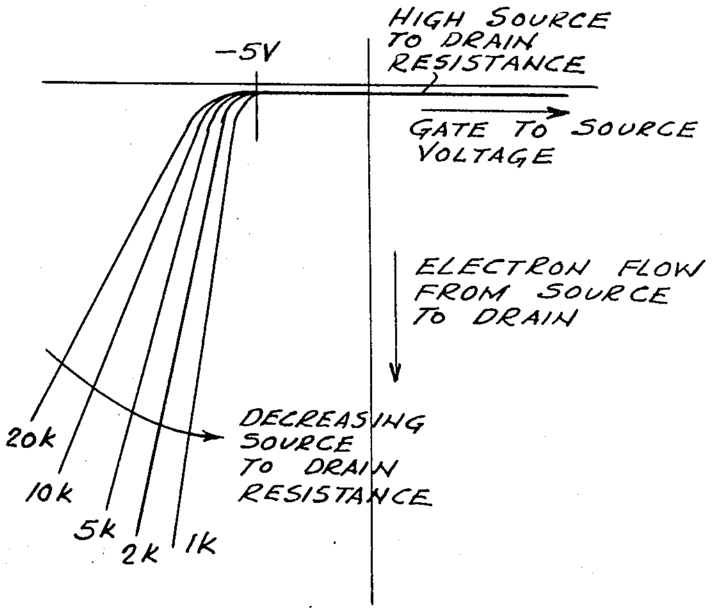
Figure 7:
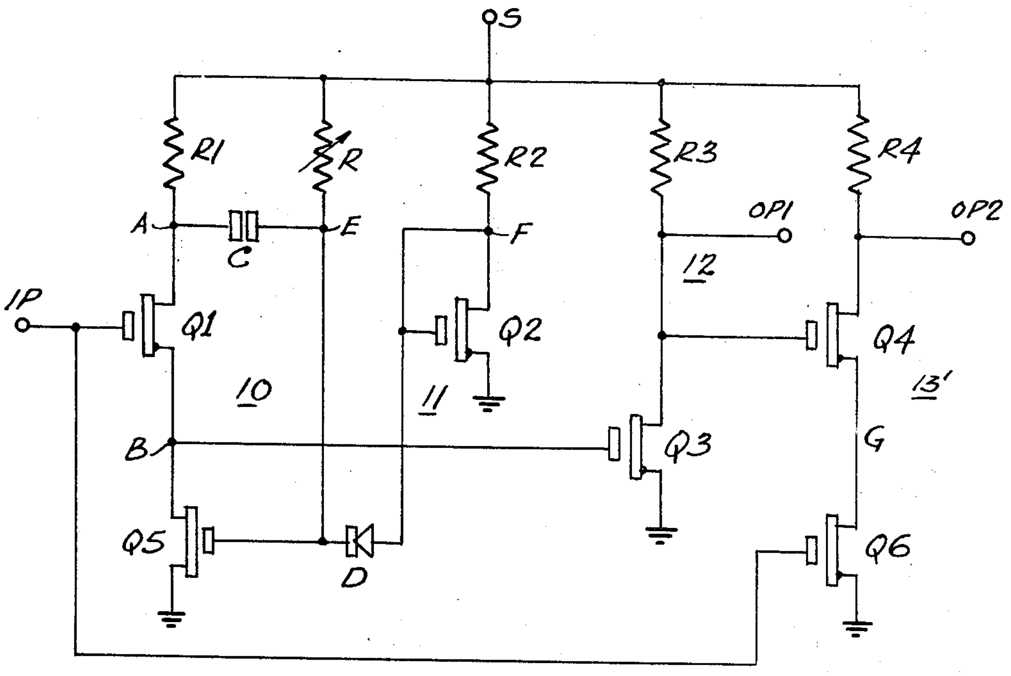

FIG. 3*a* shows an embodiment of one of the load resistances used in the circuit of FIG. 1;

FIG. 3*b* is an alternative to FIG. 3*a*;

FIG. 4*a* is a partial plan view showing a physical embodiment of one of the MOS transistors used in the circuit of FIG. 1;

FIG. 4*b* is a cross-section along the line IV*b*—IV*b* in FIG. 4*a*;

FIG. 5 is a graph showing the threshold characteristics of the MOS transistor of FIGS. 4*a* and 4*b*;

FIG. 6*a* shows a portion of the circuit of FIG. 1;

FIG. 6*b* shows a circuit equivalent to the circuit portion of FIG. 6*a*;

FIG. 7 shows a second embodiment of a pulse control circuit; and

Figure 8:
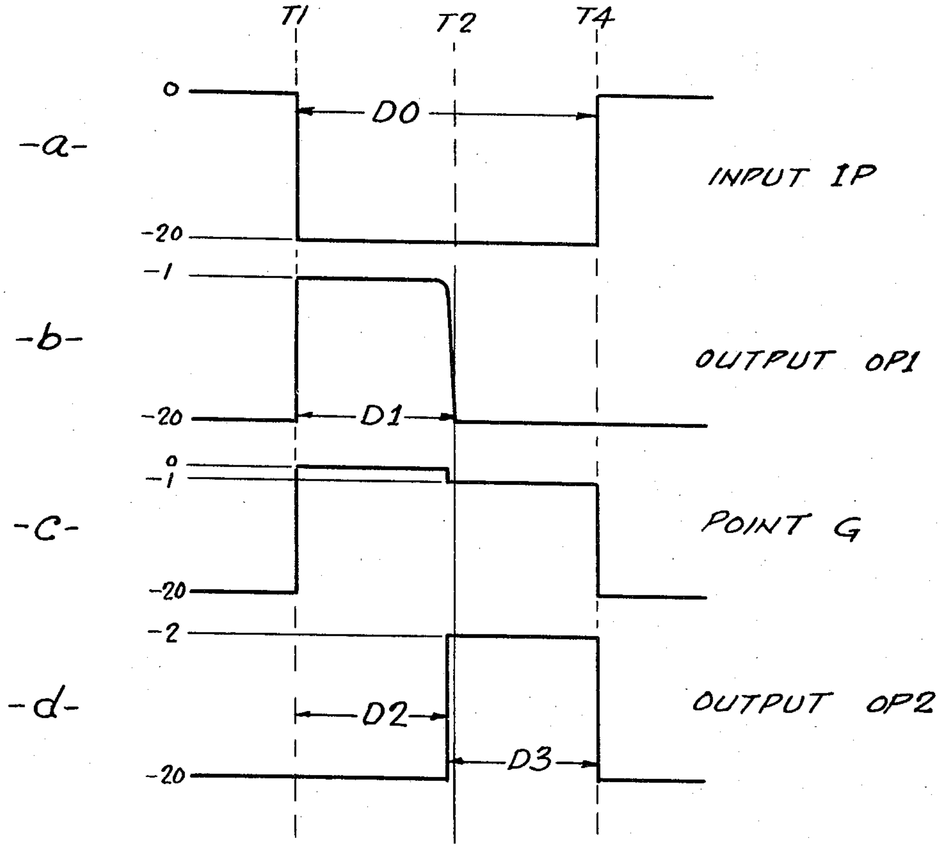

FIG. 8 is a graph showing the nature of potentials at various points in the circuit of FIG. 7.

The pulse control circuit of FIG. 1 generally consists of a time control stage 10 including two MOS transistors Q1 and Q5, a load resistor R1, a capacitor C and a potentiometer R; a clamp stage 11 including a MOS transistor Q2, a diode D and another load resistor R2; a first output stage 12, including a MOS transistor Q3 and a load resistor R3; and a second output stage 13 including a MOS transistor Q4 and a load resistor R4.

The five MOS transistors are formed by the integrated circuit technique and are therefore similar to each other. As shown in FIGS. 4*a* and 4*b*, each MOS transistor device has three electrodes formed by strips 14, 15, 16 of metal, such as aluminum, which strips are embedded in and separated from each other by a thin layer 17 of silicon oxide deposited on a substrate 18 of silicon. Portions of the outer two electrode strips 14, 15 extend through windows 21, 22 in the layer 17 to contact diffusion zones within the substrate 18 which zones form the source 24 and the drain 25 of the device. The middle strip 16 is insulated from the substrate 18 by a very thin layer section 23 having a width W (FIG. 4*a*) to form the gate 26 of the device.

In this particular example, a so-called "enhancement type" device has been assumed, in which the diffusion zones are of the P-type and the substrate is of the N-type. It will be appreciated that a similar circuit could be assembled using "depletion type" MOS transistors with N-diffusion zones in a P-substrate.

Provided that a negative voltage is applied from drain to source, the above described enhancement type device will conduct if the voltage from gate to source is more negative than a predetermined threshold voltage, while the device will be shut off if the gate to source voltage is more positive than such threshold voltage. The MOS transistors used in the circuit of FIG. 1 have a typical threshold voltage of —4.0 to —6.0 volts, an average of —5.0 volts being assumed for the explanation of the operation given below. As illustrated in FIG. 5, if the voltage at the gate relative to the source is made more positive than the threshold voltage (—5 volts), the device is turned off (off-condition) resulting in a resistance between drain and source of approximately 1000 megohms, while, if the voltage at the gate relative to the source falls below the threshold voltage (on-condition), the resistance between drain and source becomes as small as a few kilohms or less, depending on the gate width W. In the following, a typical voltage drop of approximately 1 volt will be assumed to occur between the source and the drain of each of the MOS transistors Q1 to Q5 in the on-condition. Typical values of the other elements in the circuit of FIG. 1 are as follows:

Resistance of the load resistors R1 to R4: 20 kilohms
Setting of the potentiometer R: approximately 300 kilohms
Capacitance of the capacitor C: 0.01 microfarad
Voltage drop across the diode D in its on-state: 0.5 volt In FIG. 1, the source of Q1 is connected to the drain of Q5, this conection being identified by the reference letter B, the source of Q5 is connected to ground and the drain of Q1 is connected to a voltage supply S via the load resistor R1, the connection between Q1 and R1 being identified by the reference letter A. The gate of Q1 is connected to an input terminal IP, while the gate of Q5 is connected to the voltage supply S via the potentiometer R, this latter connection being identified by the reference letter E. The capacitor C connects points A and E. The source of Q2 is grounded while its drain is connected to the voltage supply S via the load resistor R2 and also short-circuited to the gate of Q2. The connection point between Q2 and R2 is referred to by the letter F. The diode D connects points F and E with its conducting direction from F to E. The MOS transistor Q3 has its source grounded, its gate wired to point B and its drain connected to the voltage supply S via the load resistor R3, while the MOS transistor Q4 has its source grounded, its gate wired to the drain of Q3 and its drain connected to the voltage supply S via the load resistor R4. A first output terminal OP1 is connected to the drain of Q3 and a second output terminal OP2 is connected to the drain of Q4.

Figure 2:
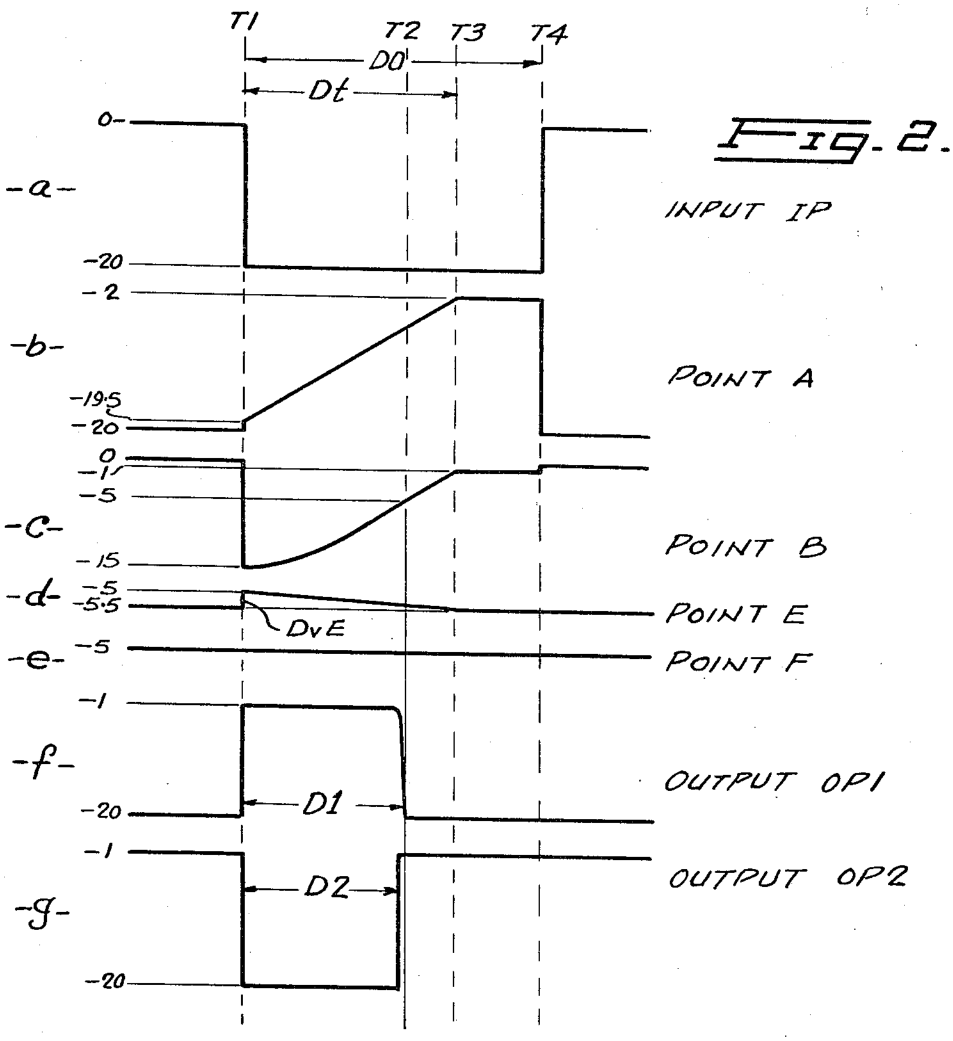
FIG. 2 is a graph showing the nature of potentials at various points in the circuit of FIG. 1.

To explain the operation of the circuit shown in FIG. 1, additional reference is made to FIG. 2. If the potential applied to the input terminal IP is zero volts (first portion of curve *a* in FIG. 2), Q1 is shut off leaving point A (curve *b*) at the potential of the voltage supply S which is assumed as a constant —20 volts.

A special situation exists at the MOS transistor Q2 the gate of which is connected to its drain. Due to this feedback connection the gate and the drain of Q2 (point F; curve *e* in FIG. 2) are held at the threshold of the device which has been assumed as —5 volts. Assuming a slight rise in the potential at point F, the gate voltage would rise above threshold thereby turning off the device. This, however, would cause the potential at the drain of Q2 to fall towards the supply voltage of —20 volts thereby in turn lowering the gate voltage. As shown in FIG. 5, if the gate voltage goes below the threshold, the resistance between the source and the drain decreases thereby raising the potential at the drain towards ground and in turn raising the gate voltage. As a result of this feedback action, the voltage at point F will stabilize at a value which is determined by the resistance of the load resistor R2 and the resistance between source and drain of Q2 at this voltage. According to the sharp bend in the characteristics occurring at approximately —5 volts (FIG. 5), point F will be constantly at —5 volts, the resistance of Q2 being, for example, 7 kilohms causing a constant current flow of about 0.75 milliamp through Q2 and R2. Thus the series connection of Q2 and R2 performs as a voltage divider with point F representing the tap.

If the connection between points E and F were open, the potential at point E would be that of the voltage supply S which is —20 volts. With the diode D, however, point E is clamped to the potential of point F of —5 volts plus the voltage drop across D of 0.5 volt, resulting in a potential at point E of —5.5 volts (first portion of curve *d* in FIG. 2). With this potential at its gate, Q5 is turned on; but since Q1 is turned off, no current flows through Q1 and Q5 and no voltage drop occurs at Q5, resulting in a potential of zero volts at point B (curve *c* in FIG. 2). With zero volts at its gate, Q3 is turned off, causing output OP1 (curve *f* in FIG. 2) to assume the potential of the supply voltage of —20 volts. The same potential exists at the gate of Q4, turning Q4 on and causing a voltage drop across Q4 of approximately 1 volt. As a result, output OP2 (curve *g* in FIG. 2) is at a level of approximately —1 volt.

At the instant T1 a voltage of —20 volts is applied to the input terminal IP turning Q1 on. With Q1 and Q5 on, the potential at A starts to rise towards ground, such voltage change being coupled through the capacitor C to point E, i.e. the gate of Q5. When the potential at point E reaches −5 volts, Q5 starts to turn off, thereby preventing any further immediate rise in the potential of point A and therefore accordingly in the potential at point E. With Q5 in this transitional condition, the potential at the drain of Q5 (point B) will go to a value intermediate that of point A and ground, depending on the resistance of Q5 in this condition, e.g. typically a value of approximately −15 volts, thereby turning Q3 on and raising the potential at output OP1 to −1 volt corresponding to the voltage drop across Q3 in its on-state. With this potential applied to the gate of Q4, it is turned off and output OP2 goes to −20 volts.

During the time interval T1 to T3, the capacitor C causes the potential at point E to return gradually to the clamping voltage of −5.5 volts (curve *d* in FIG. 2). Due to this drop of the gate voltage of Q5, the resistance of Q5 slowly decreases thereby raising the potential at point A. It will be noticed that the change in the potential at point A is opposite in sign from that at point E, the circuit thereby acting as a negative feedback connection causing substantially linear change of the potentials at A and E, as will be explained below. When Q5 is rendered saturated by the increasing gate voltage, which condition will occur before the gate voltage has become as negative as −5.5 volts, the potential at the drain of Q5 (point B) begins to follow the voltage at point A with a difference of 1 volt between them, due to the voltage drop that exists across Q1. The change in the potentials at points A and B will continue until point B reaches a level of −1 volt, since this is the minimum voltage drop across Q5. This instant is identified in FIG. 2 as T3.

At the instant T2, the potential at point B passes through a level of −5 volts. At this time, Q3 turns off, restoring a potential of −20 volts at output OP1 and at the gate of Q4, thereby turning Q4 on again and causing output OP2 to reassume a potential of −1 volt.

Upon occurrence of the trailing edge of the input pulse at the instant T4, the potentials at points A and B will return to their original levels.

Referring now to FIGS. 6*a* and 6*b*, the above mentioned feedback action taking place in the time interval T1 to T3 will be explained. The part of the time control stage 10 comprising the MOS transistors Q1, Q5 and the load resistor R1 generally referred to in FIG. 6*a* by the reference numeral 20 can be considered as equivalent to an amplifier having a gain factor K. Such amplifier 20′ is shown in the equivalent time control stage 10′ of FIG. 6*b* having a capacitor C of the same capacitance as the capacitor C in FIG. 6*a* and a resistor R of the same resistance as the potentiometer R in FIG. 6*a*.

Considering any instant within the time interval T1 to T3, point A will be at a potential *v*A and point E at a potential *v*E relative to ground. The constant voltage applied to the terminal S may be VS. According to the Kirchhoff equation for the point E, the following relationship exists between the current *i*C through the capacitor C, the current *i*R through the resistor R and the current *i*Q at the input of the amplifier 20′:

$$iC+iR+iQ=0 \qquad (1)$$

Expressed in terms of the existing potentials and impedances, Equation 1 can be rewritten in relation to time *t* as $$C\frac{d}{dt}(vE-vA)+\frac{vE-VS}{R}+iQ=0 \qquad (2)$$

As stated above, the gate of an MOS transistor is isolated from its source and its drain (FIG. 4*b*). With regard to Q5, this causes the amplifier input current to be zero:

$$iQ=0 \qquad (3)$$

The output voltage *v*A of the amplifier 20′ is related to the input voltage *v*E by the following equation:

$$vA=-K.vE \qquad (4)$$

The negative sign in Equation 4 indicates that the output voltage *v*A is inverted with respect to the input voltage *v*E.

By introducing Equations 3 and 4 into Equation 2 and rearranging, the following differential equation is obtained:

$$C(1+K)\frac{dvE}{dt}+\frac{vE}{R}-\frac{VS}{R}=0 \qquad (5)$$

which is solved by $$vE=VS\left(1-\exp\left(-\frac{t}{RC(1+K)}\right)\right) \qquad (6)$$

As will be appreciated from Equations 5 and 6, the effective capacity is increased by the factor $(1+K)$ resulting in an accordingly extended time constant $RC(1+K)$ of the circuit. This effect is known as the "Miller effect."

If $$t\ll RC(1+K) \qquad (7)$$

Equation 6 can be approximated by $$vE\approx\frac{VS}{RC(1+K)}t \qquad (8)$$

according to which the potential *v*E at the point E rises linearly with time. From Equation 8 the time interval D*t* (FIG. 2) between the instants T1 and T3 becomes $$Dt=\frac{DvE}{VS}RC(1+K) \qquad (9)$$

wherein D*v*E is the total potential change at the point E during this time interval, which according to curve *d* in FIG. 2 equals 0.5 volt. The term D*v*E can also be regarded as the difference between the threshold potential at the gate of the MOS transistor Q5 and the clamping potential produced by the stage 11. Assuming a constant voltage VS of −20 volts, Equation 9 becomes $$Dt=0.025RC(1+K) \qquad (10)$$

showing that the above assumption of Equation 7 was justified.

As stated above, the width D1 of the output pulse at terminal OP1 (curve *f* in FIG. 2) depends on the instant at which the potential at the point B passes through −5 volts, i.e. on the slope of the curve *c*, which has been stated as being equal to the slope of curve *b* during the latter part of the time interval D*t*. This slope can be derived from Equations 9 and 4 as $$\frac{DvA}{Dt}=-\frac{K.VS}{RC(1+K)} \qquad (11)$$

By changing the resistance of the potentiometer R, the width D1 of the output pulse can be varied. If the resistance is reduced, the pulse width decreases. With elements having the typical values given above, the width D1 will be approximately 3 milliseconds.

If the gain K of the amplifier 20′ is made much greater than unity, Equation 11 can be simplified to $$\frac{DvA}{Dt}=-\frac{VS}{R.C} \qquad (12)$$

Thus, the resulting slope of the curves *b* and *c* in FIG. 2 becomes independent of the value of the gain K.

As can be seen from curve *f* in FIG. 2, the potential at the terminal OP1 starts to drop shortly before occurrence of the instant T2, namely when the potential at the gate of Q3 (curve *c* in FIG. 2) enters the bend in the characteristic curves of FIG. 5. Since the change in the potential at the gate of Q3 is relatively slow, the trailing edge of the output pulse at OP1 shows a certain slope. Since the potential at the terminal OP1 passes relatively fast through −5 volts, the MOS transistor Q4 is turned on almost instantaneously, resulting in a substantially vertical trailing edge of the output pulse at OP2. It is due to the slope of curve *f* in FIG. 2, that the width D2 of the output pulse at OP2 is a little smaller than the width D1 of the output pulse at OP1.

It has been shown that the circuit of FIG. 1 produces a positive-going output pulse at terminal OP1 and an inverted or negative-going output pulse at terminal OP2 upon occurrence of a negative-going input pulse at terminal IP, and that the widths D1, D2 of the output pulses are constant and independent of the duration D0 of the input pulse, as long as such duration is longer than the output pulses. If the input pulse is shorter than the predetermined widths D1, D2, the duration of the output pulses will be substantially equal to that of the input pulse.

In FIG. 1, the load resistors R1 to R4 are represented by symbols which are commonly used to designate the usual type of carbon resistors or the like. In a circuit according to the teachings of this disclosure it is advantageous, however, to form these load resistors by means of a MOS transistor designated in FIG. 3*a* as R*n*. The drain and the source of the MOS transistor R*n* form the two terminals of such resistor, while the gate is short circuited to the drain. As explained above in connection with the MOS transistor Q2 of the clamp stage 11, the feedback connection between the gate and the drain causes the MOS transistor to operate at a point on its characteristic curve close to its threshold voltage. For the MOS transistor Q2, a characteristic curve has been assumed according to which the resistance between source and drain is approximately 7 kilohms at such operating point. However, by tailoring the physical width W of the gate 17 (FIG. 4*a*), the slope of the characteristic curve (FIG. 5) and thus the source-to-drain resistance of the MOS transistor can be varied. As the width W is increased, the resistance between source and drain is decreased. By this method, resistances are obtainable in a range from 1 to 100 kilohms approximately. As explained above, a voltage drop approximately equal to the threshold voltage occurs between the source and the drain of the feedback connected MOS transistor R*n*. To provide the full —20 volts of the voltage supply at the source of the MOS transistor R*n*, the gate can be connected to another supply of —25 volts as shown in FIG. 3*b*.

In the circuit of FIG. 1, the MOS transistor Q2 is constantly in its unsaturated on-condition and the MOS transistor Q4 is in its on-condition if no input pulse is applied to the input terminal IP. As a result, Q2 and Q4 cause a residual current to flow in the inoperative condition of the circuit. Such residual current is reduced in the circuit of FIG. 7 which differs from that of FIG. 1 only in the second output stage 13' in which the source of Q4 is connected to the drain of a further MOS transistor Q6, the gate of which is connected to the input terminal IP and therefore gated by the input pulse. In FIG. 7, the connection between the drain of Q6 and the source of Q4 is designated with the reference letter G.

When applying to the input terminal IP the negative-going signal (shown in curve *a* of FIG. 2 and again in curve *a* of FIG. 8), the same potential changes as described in connection with the circuit of FIG. 1 take place at the points A, B, E and F (see curves *b* to *e* in FIG. 2) resulting in the same positive-going output pulse of controlled length at the terminal OP1 (curve *f* in FIG. 2 and equally curve *b* in FIG. 8).

In the rest condition of the circuit, if there is no input signal, the MOS transistor Q6 is cut off resulting in a potential of —20 volts at point G (curve *c* in FIG. 8) and similarly a potential of —20 volts at the output terminal OP2 (curve *d* in FIG. 8). The negative-going input pulse at the terminal IP turns Q6 on, but at the same time causes the potential at the output terminal OP1 to rise to —1 volt (curve *b*) and thereby shuts Q4 off. As a result, the potential at the terminal OP2 remains at —20 volts until the potential at the gate of Q4 falls below the threshold of Q4 which according to the graph in FIG. 8 takes place shortly before occurrence of the instant T2. Q4 is thereafter in its on-condition causing a current to flow through the MOS transistors Q6 and Q4 and the load resistor R4 which will cause a voltage drop of —1 volt across Q6 (curve *c*) and an output potential of —2 volts at the terminal OP2 (curve *d*).

Upon occurrence of the trailing edge of the input pulse the original potentials are restored, thus terminating the output pulse at OP2.

As explained above, the output pulse at OP1 has a width D1 which is determined only by the values of the circuit elements and its independent of the duration D0 of the input pulse, provided that D0 is greater than D1. As can be understood from a comparison of curves *a*, *b*, and *d* in FIG. 8, the output pulse at OP2 is no longer the inversion of the output pulse at OP1, as in the circuit of FIG. 1, but is now delayed relatively to the leading edge of the input pulse by the width D2 which is a little smaller than D1 as explained above. Since the output pulse at OP2 is terminated by the trailing edge of the input pulse, the width D3 of the output pulse at OP2 approximately equals the duration D0 of the input pulse minus the width D1 of the output pulse at OP1. By increasing or decreasing the resistance of the potentiometer R, the width D1 of the output pulse at OP1 can be increased or decreased, respectively, thereby increasing or decreasing the delay D2 and decreasing or increasing respectively the width D3 of the output pulse at OP2.

As in the circuit of FIG. 1, the load resistors R1 to R4 may be formed in practice by further MOS transistors R*n* according to FIGS. 3*a* or 3*b*.

One of the advantages of using MOS transistors to form the load resistors resides in the fact that the gain of a circuit shown in FIGS. 3*a* or 3*b*, which functions as an inverter stage, remains constant with temperature. Variations in temperature will not affect the ratio of the resistances of R*n* to Q to which the gain of such inverter stage is directly related. Therefore, Equations 11 and 12 are true for any temperature changes, resulting in a constant width of the output pulses from the circuits of FIGS. 1 or 7.

I claim:

1. An electrical circuit for generating a pulse of controlled characteristics, comprising (a) a series connection extending from a first voltage supply terminal through the current electrodes of a first MOS transistor, then through the current electrodes of a second MOS transistor and then through a load resistance to a second voltage supply terminal;

(b) a timing branch including a series circuit of a capacitance and a resistance and extending from the junction between said second MOS transistor and said load resistance to said second supply terminal;

(c) the gate of said first MOS transistor being connected to the junction between said capacitance and resistance of said timing branch;

(d) means for supplying to the gate of said first MOS transistor a clamping potential within the on-condition of said first MOS transistor, said means being such as to limit the difference between said clamping potential and the threshold potential at said gate to a value small in comparison with the voltage across said first and second supply terminals;

(e) input means connected to the gate of said second MOS transistor; and (f) output means connected to the junction between said first and said second MOS transistors.

2. The circuit of claim 1, wherein said output means comprises (a) a further series connection extending from said first to said second supply terminal through the current electrodes of a third MOS transistor and another load resistance;

(b) and an output terminal connected to the junction between said third MOS transistor and said other load resistance;

(c) the gate of said third MOS transistor being connected to the junction between said first and second MOS transistors.

3. The circuit of claim 1, wherein said clamping potential supply means comprises (a) voltage divider means having a tap and being connected across said first and second supply terminals; and (b) a diode connected between said tap and the gate of said first MOS transistor.

4. The circuit of claim 3, wherein said voltage divider means comprises (a) a further series connection through the current electrodes of a further MOS transistor and a further load resistance;

(b) the gate of said further MOS transistor being short-circuited to the junction between said further MOS transistor and said further load resistance; and (c) said tap being the gate of said further MOS transistor.

5. The circuit of claim 1, wherein said timing branch resistance includes a potentiometer.

6. The circuit of claim 2, wherein said output means further comprises (a) another series connection extending from said first first to said second supply terminal through the current electrodes of a fourth MOS transister and a further load resistance; and (b) another output terminal connected to the junction between said fourth MOS transistor and said further load resistance;

(c) the gate of said fourth MOS transistor being connected to the junction between said third MOS transistor and said other load resistance.

7. The circuit of claim 2, wherein said output means further comprises (a) another series connection extending from said first to said second supply terminal through the current electrodes of a fifth MOS transistor, the current electrodes of a fourth MOS transistor and a further load resistance; and (b) another output terminal connected to the junction between said fourth MOS transistor and said further load resistance;

(c) the gate of said fourth MOS transistor being connected to the junction between said third MOS transistor and said other load resistance; and (d) the gate of said fifth MOS transistor being connected to said input means.

8. The circuit of claim 1, wherein said load resistance is formed by a MOS transistor, the source and drain of which represent the terminals of the load resistance.

9. The circuit of claim 8, wherein the gate of said resistance-forming MOS transistor is short-circuited to its drain.

10. The circuit of claim 8, wherein a fixed voltage is provided between the gate and the drain of said resistance-forming MOS transistor, said voltage substantially equalling the threshold voltage of said MOS transistor.

References Cited

UNITED STATES PATENTS

| | | | |
|---|---|---|---|
| 3,214,612 | 10/1965 | Hickey | 307—246 |
| 3,286,189 | 11/1966 | Mitchell et al. | 307—279 XR |
| 3,480,796 | 11/1969 | Polkinghorn et al | 307—246 XR |

STANLEY T. KRAWCZEWICZ, Examiner

U.S. Cl. X.R.

307—246, 251, 279, 304